US011239656B2

(12) United States Patent
Hastings

(10) Patent No.: US 11,239,656 B2
(45) Date of Patent: Feb. 1, 2022

(54) METHODS AND APPARATUS FOR CURRENT SENSING AND CURRENT LIMITING

(71) Applicant: Texas Instruments Incorporated, Dallas, TX (US)

(72) Inventor: Roy Alan Hastings, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 69 days.

(21) Appl. No.: 16/517,019

(22) Filed: Jul. 19, 2019

(65) Prior Publication Data

US 2021/0021122 A1 Jan. 21, 2021

(51) Int. Cl.
*H02H 9/02* (2006.01)
*H02H 1/00* (2006.01)
*G01R 19/165* (2006.01)

(52) U.S. Cl.
CPC ....... *H02H 9/025* (2013.01); *G01R 19/16519* (2013.01); *H02H 1/0007* (2013.01)

(58) Field of Classification Search
CPC .. H02H 9/025; H02H 1/0007; G01R 19/0092; G01R 19/16519; H02M 1/0009
See application file for complete search history.

(56) References Cited

U.S. PATENT DOCUMENTS 5,815,027 A * 9/1998 Tihanyi ............... G01R 1/203
327/543
6,377,034 B1 * 4/2002 Ivanov .................. G05F 3/245
323/224

9,769,090 B2 9/2017 Stanford et al.
10,168,363 B1 * 1/2019 Petenyi ............. G01R 19/0092
(Continued)

FOREIGN PATENT DOCUMENTS

JP 2009075957 A 4/2009

OTHER PUBLICATIONS

Lee, B.S., "Understanding the terms and definitions of LDO voltage regulators," Texas Instruments Application Report SLVA079, Oct. 1999. Obtained from https://www.ti.com/lit/an/slva079/slva079.pdf?ts=1625139597494 on Jul. 1, 2021. (Year: 1999).*

(Continued)

*Primary Examiner* — Fred E Finch, III
(74) *Attorney, Agent, or Firm* — Michelle F. Murray; Charles A. Brill; Frank D. Cimino

(57) ABSTRACT

Methods, apparatus, systems and articles of manufacture are disclosed for current sensing and current limiting. An example apparatus includes a first main transistor including a first main transistor gate terminal coupled between an output terminal and an intermediate node; a second main transistor including a second main transistor gate terminal coupled between the intermediate node and a ground terminal; a first amplifier including a first amplifier output coupled to the first main transistor gate terminal; a second amplifier including a second amplifier output coupled to the second main transistor gate terminal; and a third amplifier including a third amplifier inverting input coupled to the intermediate node, a third amplifier non-inverting input coupled to a sense transistor, and a third amplifier output coupled to a third gate terminal of a third transistor.

18 Claims, 4 Drawing Sheets

(56) References Cited

U.S. PATENT DOCUMENTS

| | | | |
|---|---|---|---|
| 10,216,208 B2* | 2/2019 | Peluso | G05F 1/575 |
| 2006/0165096 A1 | 7/2006 | Heath et al. | |
| 2007/0296391 A1* | 12/2007 | Bertin | G01R 35/005 |
| | | | 323/303 |
| 2014/0347078 A1* | 11/2014 | Qin | G01R 19/0092 |
| | | | 324/713 |
| 2015/0309524 A1* | 10/2015 | Levhar | G01R 31/00 |
| | | | 327/540 |
| 2016/0241019 A1* | 8/2016 | Li | H02H 9/025 |
| 2018/0123578 A1* | 5/2018 | Chauhan | H03K 17/687 |
| 2018/0152017 A1* | 5/2018 | Langer | H02H 9/025 |
| 2019/0220049 A1* | 7/2019 | Qiu | H02H 9/001 |
| 2019/0265280 A1* | 8/2019 | Kimura | G05F 3/30 |
| 2020/0081466 A1* | 3/2020 | Ideno | G05F 1/575 |

OTHER PUBLICATIONS

International Search Report dated Oct. 8, 2020, PCT Application No. PCT/US2020/042717, 2 pages.
Written Opinion dated Oct. 8, 2020, PCT Application No. PCT/US2020/042717, 4 pages.

* cited by examiner

METHODS AND APPARATUS FOR CURRENT SENSING AND CURRENT LIMITING

FIELD OF THE DISCLOSURE

This disclosure relates generally to current and, more particularly, to current sensing and limiting.

BACKGROUND

Current sensing is a technique used to measure electric current. The currents measured range from picoamps to tens of thousands of amperes. There are several ways to implement current sensing to determine the currents measured range. The selection of a current sensing method depends on the current requirements of a circuit such as magnitude of the current, accuracy of the current measured, bandwidth, robustness of the components conducting current, cost of the circuit implementing the current sensing method, if isolation of current is to be considered or size of the circuit. A current value may be generated during the sensing of current and may be directly displayed by an instrument or converted from analog to digital form for use by a monitoring or control system.

Figure 1:
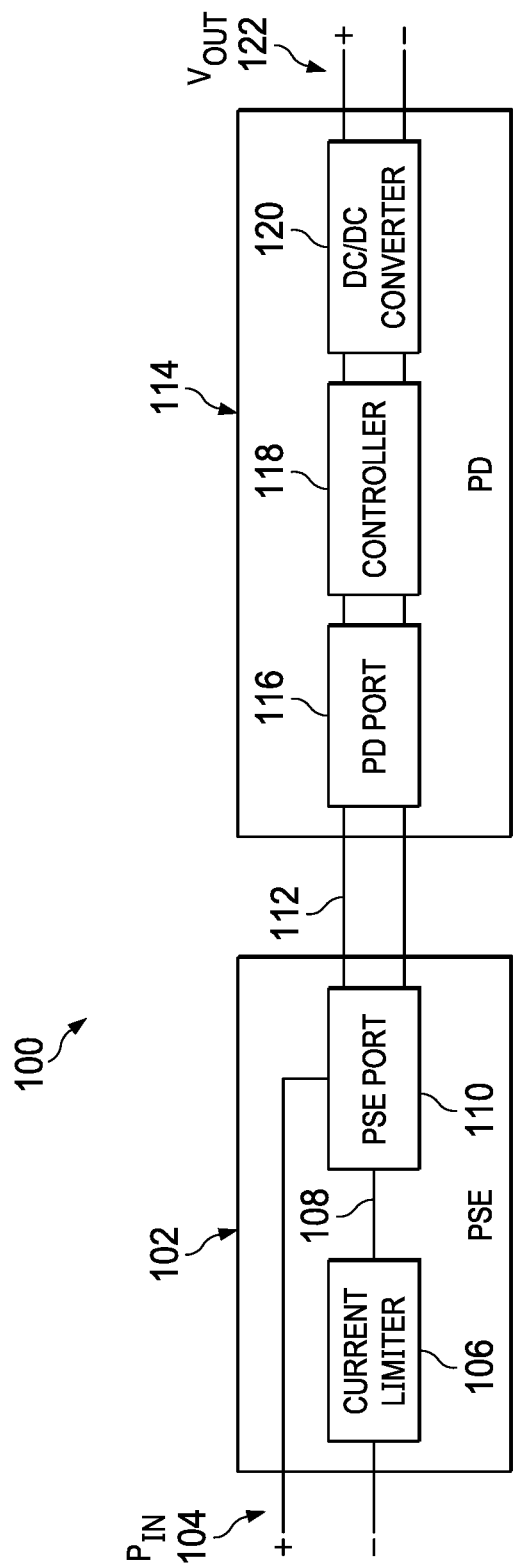
FIG. 1 is a block diagram of a system in which a power sourcing equipment (PSE) provides power to a power device (PD) over an ethernet connection.

The figures are not to scale. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Methods to sense and limit current are disclosed herein. Many applications require sensing current flowing through a power metal oxide semiconductor field effect transistor (MOSFET). Applications such as Power over Ethernet (PoE) require the sensing of current through Power Sourcing Equipment (PSE) by utilizing current sensing methods in the PSE.

PoE is a standard that allows network cables to carry data and electrical power to end nodes such as telephones in a telecom system, digital cameras in a security system, wireless adapters, etc.

PSE is a device that provides power on the Ethernet cable and decides how much current a device in which the power is supplied can use before the current becomes an overload for the PSE to provide to the device in the system. The PSE includes current sensing and current limiting designs that measure the amount of current a device draws and limits the current when the device is at or above full capacity. Examples disclosed herein include such designs for high-voltage applications such as PoE applications.

In some current sensing design examples, a sense MOSFET (senseFET) is used to "sense" (e.g., identify, measure, etc.) the current conducting through a main MOSFET (mainFET). As used herein, a senseFET is of the same type as the mainFET, but the width/length (W/L) ratio of the senseFET is much smaller, so that only a negligible current flows through the senseFET. The W/L ratio is the ratio of the physical width to physical length of a MOSFET channel that determines the current flow through the MOSFET. For example, in a MOSFET, the channel, when in the saturation region (e.g., the region in which in which the drain current becomes almost independent of drain-to-source voltage) acts as a conductor. Additionally, the channel, when in the linear region (e.g., the region where the drain to source voltage is small, therefore resulting in an approximately linear relationship between drain to source voltage and drain to source current), acts as a conductor. In the linear region, the size of the channel (e.g., the width and length) determines the resistance of the channel, thus controlling the amount of the drain current when a specific voltage is applied to the drain terminal. In the saturation region, a pinched-off region forms at the drain end of the channel. If there is a further increase in drain-to-source voltage, the voltage appears across the pinched-off region and does not affect the channel (e.g., the channel still remains pinched-off) and the drain current becomes fixed (e.g., saturated). Examples disclosed herein include a senseFET with the same length but different widths as the mainFET to sense the current sourced by the PSE to an end node (e.g., a powered device, PD).

In some current limiting design examples, a first amplifier is used to compare an analogue of voltage (e.g., a voltage representing the current of an end node such as a PD) with a predefined current limit voltage. A second amplifier is used to adjust the drain current through the senseFET so the drain-to-source voltages of the mainFET and the senseFET are equal, therefore the current conducting through the senseFET is a replica of the current conducting through the mainFET (e.g., like a current mirror). Typically, the second amplifier requires a low input offset voltage (e.g., the voltage difference between the inputs for the amplifier to operate in a closed feedback loop) to ensure no more than a threshold percent difference (e.g., the acceptably small difference) in drain voltages for each MOSFET.

Examples disclosed herein utilize cascoded power MOSFETS to separate the high voltage of PoE applications from the internal circuitry that is used to sense the current of the end nodes. Cascoding power MOSFETs is stacking two or more MOSFETs in series. An upper power mainFET (e.g., the cascade) is coupled to the external load and arranged to receive a greater portion of the external load output voltage relative to a lower power mainFET (e.g., the cascoded transistor). The lower power mainFET is coupled to the upper power mainFET and arranged to control the current flowing through the two mainFETs. In examples disclosed herein, the upper power mainFET is designed for high-voltage (e.g., 40 volts, 50 volts, 60 volts, 70 volts, etc.), thus dissipating virtually all the heat during current limiting. In this manner, the lower power mainFET is provided with less voltage, which reduces the heat generated in the lower power mainFET and thus improves the accuracy of current sensing.

FIG. 1 is a block diagram of an example PoE environment 100 to provide power and data to a powered device (PD). A PoE switch includes internal circuitry, such as the ones illustrated in FIGS. 2 and 3, that monitors and controls the current being provided to PDs. The example PoE environment 100 includes an example power sourcing equipment (PSE) 102 and an example PD 114 to communicate over an example ethernet cable 112. The example PSE 102 includes an example current limiter 106 and an example PSE port 110 and the example PD includes an example PD port 116, an example controller 118, and an example DC to DC converter 120.

FIG. 1 includes the example PSE 102 to detect the example PD 114 and negotiate the amount of power available or required to provide to the example PD 114. For example, the PSE 102 provides network data and power to the PD 114 over the ethernet cable 112. The example PSE 102 receives power from DC power supply, DC to DC converter, etc., via the example input terminal 104. The example PSE 102 is generally utilized for wired Ethernet local area networks (LANs) and allows the electrical current necessary for the operation of each PD 114 to be carried by the data cables rather than by power cords, which minimizes the number of wires that are used to install a network. PSE 102 may also be utilized because the voltages used in PoE powered devices are so low that they don't require a licensed electrician to install them, code inspectors to check them, etc.

In FIG. 1, the example PSE 102 includes the example current limiter 106 to provide applicable current over the example Ethernet cable 112 to the example PD 114. The example current limiter 106 is coupled to the example PSE port 110 via a current limit terminal output 108. The example current limiter 106 regulates the current provided to the example PD 114 via the example PSE port 110. The example current limiter 106 is described in further detail below in connection with FIG. 3.

FIG. 1 includes the example PSE port 110 to distribute voltage over the example ethernet cable 112. In some examples, the PSE port 110 includes two center tapped transformers, wherein the input terminal 104 includes a positive lead coupled to a center tap of one transformer and a negative lead coupled to the current limiter and further coupled to a center tap of a different transformer via the current limit terminal output 108. A transformer is an electrical device that transfers electrical energy from one circuit to another circuit via a core and two coil windings. A center tapped transformer is a contact made to a point halfway along one of the windings of the transformer to extract common-mode voltage (e.g., the average of the voltages at the two ends of the winding). The example PSE port 110 may be the standard Ethernet isolation transformer that is required by IEEE 802.3 for transmission of data and power over the ethernet cable 112.

FIG. 1 includes the example Ethernet cable 112 to transmit the power and the data from the example PSE 102 to the example PD 114. In some examples, the Ethernet cable 112 is a Gigabit Ethernet (e.g., 1000 BASE-T, which requires a Category 5 cable) which includes four twisted pairs: a main receive pair, a main transmit pair, a spare receive pair, and a spare transmit pair. The example PSE port 110 can be coupled to either one end of the main receive pair and the main transmit pair or one end of the spare receive pair and the spare transmit pair. A two-pair PSE solution (e.g., PSE 102) can choose to power either the main pairs or the spare pairs. The example PD 114 accepts power on either the main pairs or the spare pairs and does this by inserting two bridge rectifiers, one coupled to the centertaps of the main pairs and the other to the centertaps of the spare pairs. In this example, the bridge rectifiers couple to the example controller 118. Thus any PD will accept power from either the main pairs or from the spare pairs. For example, the main receive pair is coupled to the upper tap and lower tap of one of the transformers in the PSE port 110 and the main transmit pair is coupled to the upper tap and lower tap of a different transformer in the PSE port 110. In some examples, all four pairs of the ethernet cable 112 can be coupled to the PSE port 110 and the PD port 116. For example, in a four-pair PoE implementation, the PSE 102 injects power onto the main pairs from one port (e.g., the PSE port 110), and onto the spare pairs from a second port (e.g., the PSE port 110). In this example, the PD 114 remains the same, wherein the bridge rectifiers direct power from both sets of pairs into PD power path to the example controller 118.

The example Ethernet cable 112 can be used to carry signals such as video and current in two, or all four, of the pairs. The example Ethernet cable 112 assists the example PSE 102 and the example PD 114 in communication to determine when power to the example PD 114 should be removed, limited, or supplied.

FIG. 1 includes the example PD 114 to receive and utilize power provided via the example PSE 102. The example PD 114 may be a telephone of a telephone system, a security camera, a network switch, etc. The example PD 114 is communicating, transmitting and receiving data, etc., over the example ethernet cable 112 from the example PSE 102. In some examples, the PD 114 continuously draws current from the PSE 102 while the PSE 102 monitors how much current is being drawn. If the example PSE 102 or PD 114 is over-drawing current (e.g., exceeding the maximum current requirement set by the PD manufacturer or exceeding the amount of current the PSE 102 can supply), the example current limiter 106 applies current limiting techniques to reduce the current the example PD 114 is drawing. For example, when a connection is made between a PSE 102 and a PD 114, they negotiate how much power the PD 114 will be permitted to draw during a so-called "classification" process. After this process is complete, the PSE 102 limits the current it will provide to a maximum based on this negotiation. Examples disclosed in FIG. 3 facilitate the current sensing and current limiting of the example PD 114.

In FIG. 1, the example PD 114 includes the example PD port 116 to receive power from the example ethernet cable 112 and transmit power to the example controller 118. For example, the PD port 116 includes four center-tapped transformers, wherein the center tap is coupled to a diode bridge rectifier. A diode bridge is an arrangement of four or more diodes in a bridge circuit configuration that ensures the PoE environment 100 transmits DC power, not AC power, and to make the PD 114 agnostic with respect to polarity. For example, if the main transmit pair is positive and the main receive pair is negative, then the diode bridge rectifier ensures the example PD 114 can still extract power. Also, if the main transmit pair is negative and the main receive pair is positive, the diode bridge rectifier ensures the example PD 114 can still extract power. The example PD port 116 maintains a steady flow of current from the ethernet cable 112 via the diode bridge rectifier, which allows the PSE 102 to accurately sense the amount of current the PD 114 is drawing.

In FIG. 1, the example PD 114 includes the example controller 118 to support detection, classification, and overcurrent protection. For example, when the PD 114 is implemented in the PoE environment 100, a resistor of a specified value is coupled to the backside of two bridge rectifiers. Then, the example PSE 102 probes the example ethernet cable 112 to determine the resistance, which is a detection signature. In some examples, non-PoE ethernet is unable to apply this detection signature and the example PSE 102 will not provide power to it. In some examples, the PSE 102 identifies the detection signature and applies a pattern of voltages to the ethernet cable 112 and the example PD 114 applies load currents in response to these voltages, which is considered the classification process. For example, classification is a negotiation between PSE 102 and PD 114, wherein the negotiation the amount of current the PD 114 can draw. Further, when this process is complete, the example PSE 102 applies full voltage to the example ethernet cable 112 and the example PD 114 engages (e.g., captures, draws, absorbs) the voltage via the example controller 118. The example controller 118 provides inrush current limiting due to capacitance of the applied voltage. Further, when inrush is complete, the current of the example PD 114 drops below the current limit.

Figure 2:
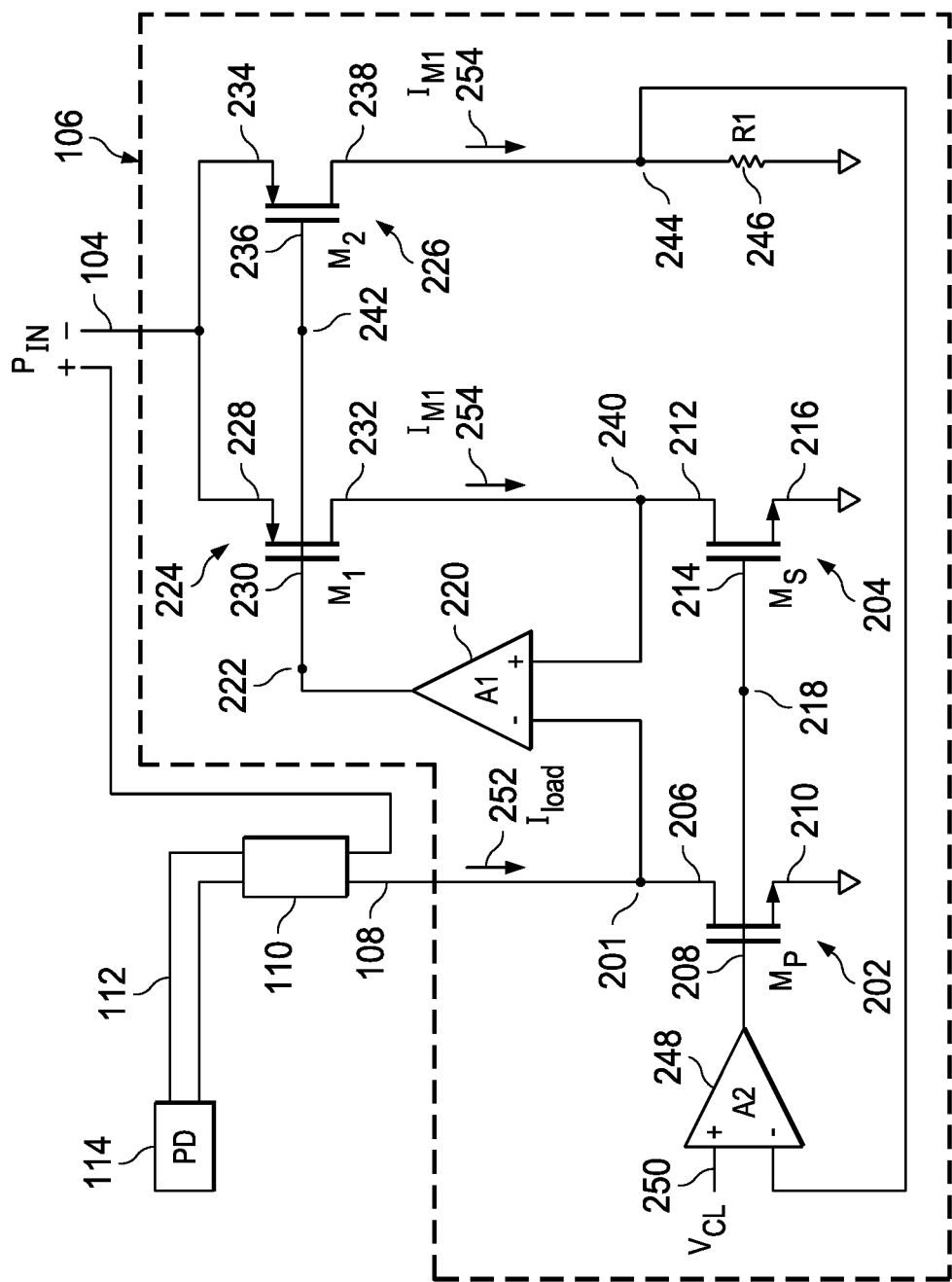
FIG. 2 is a schematic diagram showing additional detail of an implementation of the current limiting circuit of FIG. 1.

In FIG. 1, the example PD 114 includes the example DC to DC converter 120 to further convert the output of the example PD port 116 to a desirable voltage for an end device. For example, an end device may be the telephone or security camera which requires a different amount of voltage than the voltage provided by the PSE 102. The example DC to DC converter 120 may down convert the voltage. For example, if the PD 114 receives a steady 48 volts from the example PSE 102, then the DC to DC converter 120 reduces the 48 volts to 5 volts, which may be required by the telephone. The example DC to DC converter 120 outputs the converted voltage to the end device via the DC to DC output 122. FIG. 2 depicts a current sensing and limiting schematic without the high-voltage MOSFET and low-voltage MOSFET of an integrated pass transistor using a senseFET. The current sensing and limiting schematic includes the example PD 114 and the example PSE port 110 to allow the current sensing and limiting schematic without the high-voltage MOSFET and low-voltage MOSFET to sense the current drawn by the PD 114. In FIG. 2, the passFET 202 and the senseFET 204 are N-Channel metal oxide semiconductor field effect transistors (MOSFETs). The passFET 202 includes a first drain terminal 206 coupled to the example PSE port 110 at an intermediate node 201, a first gate terminal 208 coupled to the output of the second amplifier 248, and a first source terminal 210. The senseFET 204 includes a second drain terminal 212, a second gate terminal 214 coupled to the first gate terminal 208 at node 218, and a second source terminal 216.

In FIG. 2, the passFET 202 is a low-side drive power FET that may be, for example, a maximum of 60 milliohms for drain-to-source resistance and controls the current provided to the PD 114. The passFET 202 enters in the linear operation mode when the gate 208 to source 210 voltage minus the threshold voltage is less than the drain terminal 206 to source terminal 210 voltage and current conducts freely through the first drain terminal 206 to the first source terminal 210. The passFET 202 enters a cut-off operation mode when a voltage across the first gate terminal 208 to the first source terminal 210 is less than the threshold voltage, in which current stops conducting through the first drain terminal 206 to the first source terminal 210.

In FIG. 2, the senseFET 204 is a low-side drive power FET of the same type as the passFET 202 but its WI, ratio is smaller so that only a negligible current conducts through the senseFET 204. A typical W/L ratio is 1 $(W/L)_P$=10,000 $(W/L)_S$. The senseFET 204 includes a second drain terminal 212 coupled to a servo amplifier 220 at a third node 240, a second gate terminal 214 coupled to the first gate terminal 208 at second node 218, and a second source terminal 216. The senseFET 204 enters in the linear operation mode when the gate 214 to source 216 voltage minus the threshold voltage is less than the drain 212 to source 216 voltage and current conducts freely through the second drain terminal 212 to the second source terminal 216. The senseFET 204 enters a cut-off operation mode when a voltage across the second gate terminal 214 to the second source terminal 216 is less than the threshold voltage, in which current stops conducting through the second drain terminal 212 to the second source terminal 216.

In FIG. 2, the current sensing and limiting schematic without the high-voltage MOSFET and low-voltage MOSFET includes the servo amplifier 220 to adjust the drain current conducting through MOSFET M1 224 to the senseFET 204 until the voltages on intermediate node 201 and node 240 are substantially equal. The servo amplifier 220 includes a first inverting input coupled to the intermediate node 201, a first non-inverting input coupled to the third node 240, and a first output coupled to a third gate terminal 230 at a fourth node 222. A servo amplifier 220 compares the difference between the first inverting input and the first non-inverting input and produces the first output based on the difference. If the drain-to-source voltage of the senseFET 204 is lower than the drain to source voltage of the passFET 202 the output voltage of servo amplifier 220 decreases, causing the current flowing through M1 to increase and consequently causing the voltage on node 240 to increase. If the drain-to-source voltage of the senseFET 204 is greater than the drain-to-source voltage of the passFET 202, the servo amplifier 220 output voltage increases, causing the current flowing through M1 224 to decrease and consequently causing the voltage on node 240 to decrease to substantially the same voltage as on intermediate node 201.

In FIG. 2, the current sensing and limiting schematic without the high-voltage MOSFET and low-voltage MOSFET includes M1 224 to adjust the current conducting through the second drain terminal 212 and the second source terminal 216 of the senseFET, based on the first output of the servo amplifier 220 coupled to the third gate terminal 230. M1 224 is a P-channel metal oxide semiconductor field effect transistor (P-channel MOSFET) that includes a third source terminal 228, the third gate terminal 230, and a third drain terminal 232 coupled to the second drain terminal 212 of the senseFET 204 at the third node 240. The P-channel MOSFET, M1 224 begins delivering current through third drain terminal 232 when the voltage at third gate terminal 230 plus the threshold voltage of third transistor 224 is less than the voltage at third source node 228. The P-channel MOSFET ceases delivering current through third drain terminal 232 when the voltage at third gate terminal 230 plus the threshold voltage of third transistor 224 is greater than the voltage at third source node 228.

In FIG. 2, the current sensing and limiting schematic without the high-voltage MOSFET and low-voltage MOSFET includes M2 226 to impose a current to the resistor 246 to generate a voltage. M2 226 is a P-channel MOSFET that forms a current mirror with M1 224. M2 226 includes a fourth source terminal 234, a fourth gate terminal 236 coupled to the third gate terminal 230 at a fifth node 242, and a fourth drain terminal 238 coupled to the resistor 246 at a sixth node 244, M2 226 is controlled by the first output of the servo amplifier 220 and operates in saturation mode when M1 224 is operating in saturation mode.

In FIG. 2, the current sensing and limiting schematic without the high-voltage MOSFET and low-voltage MOSFET includes the resistor 246 to generate a voltage based on the current conducting from the fourth drain terminal 238. The resistor 246 is coupled to a second inverting input of a second amplifier 248 at the sixth node 244.

In FIG. 2, the current sensing and limiting schematic without the high-voltage MOSFET and low-voltage MOSFET includes the second amplifier 248 to control the passFET 202 and therefore limit the current of the load by adjusting the voltage across the first gate terminal 208. The second amplifier 248 includes a second non-inverting input 250, the second inverting input coupled to the resistor 246, and the second output coupled to the first gate terminal 208. The second non-inverting input 250 voltage is the current limit voltage which represents an analogue of the desired current limit to impose on the PD 114. The second non-inverting input 250 voltage is compared to the voltage at the second inverting input from the resistor 246 to limit the current drawn by the example PD 114 by reducing the current conducting through the first drain terminal 206 to the first source terminal 210.

In the operation of the current sensing and limiting schematic without a high-voltage transistor and a low-voltage transistor to sense the current being provided over the ethernet cable 112 to the PD 114, when the voltage across the first grate terminal 208 and the first source terminal 210 exceeds the threshold voltage of the passFET 202, the current Iload 252 from the PSE port 110 conducts through the first drain terminal 206 to the first source terminal 210 of the passFET 202. Further, the voltage difference between the intermediate node 201 and the passFET 202 is provided to the first inverting input of the servo amplifier 220 at intermediate node 201.

The servo amplifier 220 compares the voltage at the first inverting input with the voltage at the first non-inverting input. The voltage at the first non-inverting input is also the voltage across the second drain terminal 212 to the second source terminal 216 coupled to the first non-inverting input at the third node 240. If the servo amplifier 220 determines that the voltage at the first non-inverting input is less than the voltage at the first inverting input, then the servo amplifier 220 generates an output voltage on node 222 whose magnitude is proportional to the difference between the non-inverting input and inverting input of the servo amplifier 220. A decrease in voltage at node 222 causes an increase in the current conducting through transistor 224. Similarly, an increase in the voltage at node 222 causes a decrease in the current conducting through M1 224.

If the servo amplifier 220 determines that the voltage at the first non-inverting input is incrementally greater than the voltage at the first inverting input, then the output of the servo amplifier 220 increases, thus causing the current conducting out of the third drain terminal 232 of M1 224 to diminish, which in turn reduces the voltage at the first non-inverting input. The loop consisting of amplifier A1 220, M1 224, and the senseFET 204 settles to an equilibrium point at which the voltages at drain terminals 206 and 212 will be substantially equal.

The loop consisting of the servo amplifier 220, the M1 224, and the senseFET 204 always tries to match the drain-to-source voltage across the senseFET 204 with the drain-to-source voltage across the passFET 202 by adjusting the voltage across the third gate terminal 230, as described in the above paragraphs. The current IM1 254 conducting through the third source 228 to the third drain terminal 232 of M1 224 is the same current that conducts through the second drain terminal 212 to the second source terminal 216. When the current IM1 254 conducting through the third drain terminal 232 increases, the voltage across the second drain terminal 212 to the second source terminal 216 increases. The third node 240 constantly supplies the first non-inverting input of the servo amplifier 220 with a voltage indicative of the voltage difference between the voltage at third node 240 and the voltage of the senseFET 204. In response, the servo amplifier 220 responds by increasing or decreasing the output voltage in order to match the voltage across the senseFET 204 with the voltage across the passFET 202.

A challenge arises with the passFET 202 when the voltage across the passFET 202 is equal to the voltage across the senseFET 204. In a perfect world, the servo amplifier 220 would have zero offset, but in reality, the two input pins of the servo amplifier 220 have different voltage potentials. The servo amplifier 220 should include a low input offset voltage in order for the servo amplifier 220 to accurately match the drain-to-source voltage of the senseFET 204 with the passFET 202. These voltages have to match very accurately if the MOSFETS are operating in the linear region (e.g., when the gate-to-source voltage minus the threshold voltage is less than the drain-to-source voltage). The input offset requirement becomes acute if the current conducting through the passFET 202 decreases to a low value.

A typical application of the current sensing and limiting schematic without a high-voltage transistor and low-voltage transistor involves Power Sourcing Equipment (PSE) (e.g., the current limiter 106 of FIG. 1) of the PSE 102. As used herein, PSE are devices that provide source power on the Ethernet cable 112. The PSE uses the passFET 202 to control the current injected into the ethernet cable 112. To satisfy the requirements of the highest power (e.g., Type-4) PSE defined by the Institute of Electrical and Electronics Engineers (IEEE) 802.3bt and limit self-heating, the passFET 202 will have a maximum worst case resistance of about 200 milliohms and a minimum resistance of about 60 milliohms (assuming −40 to 125° C. junction temperatures as well as the usual process variations).

The PSE is to sense currents as low as 5 milliamps within an accuracy of several milliamps in order to implement the DC-DC disconnect feature described in IEEE 802.3bt. If there is 5 milliamps conducting through the passFET 202 that has minimum resistance of 60 milliohms, then there is 0.3 millivolts conducting across the first drain terminal 206 to the first source terminal 210 of the passFET 202. Any mismatch in the drain-to-source voltages of the passFET 202 and the senseFET 204 generates an equal percentage error in the current conducting through the second drain terminal 212 of the senseFET 204. The percentage error in the drain-to-source voltages equals the difference between the voltages at nodes 240 and 201, divided by the voltage at node 240 and multiplied by 100%. The percentage error in the current at second drain terminal 212 equals the deviation between the actual value of this current and the value this current would have had were the voltages at nodes 240 and 201 equal, divided by the actual value of this current and multiplied by 100%. A user can request the equal percentage error to be less than 5 percent or more, in which the servo amplifier 220 will have an input offset voltage of less than 5 percent of 0.3 millivolts (e.g., 5 percent of 0.3 millivolts is 15 microvolts). Offset voltages this small are difficult to obtain because of large changes of thermal gradients (e.g., increase in heat, decrease in heat, etc.) generated by power dissipation within the passFET 202 that disturb the operation of the servo amplifier 220. For example, any two dissimilar materials in contact generate a contact potential. In an isothermal system, all the contact potentials around any loop sum to zero. If, however, the temperatures of different contacts in the loop differs, then a net voltage difference will appear due to the Seebeck effect (e.g., more generally called the thermoelectric effect). For example, the Seebeck potential of a metal-silicon contact can equal as much as 1 mV/C. °. This means that a manufacturer or designer is to control the temperature differences within portions of the amplifier to a small fraction of a degree in order to achieve microvolt-level accuracy.

In the operation of the current sensing and limiting schematic without high-voltage transistor and low-voltage transistor to limit the current supplied to the PD 114, the passFET 202 limits the current to a maximum value for which the voltage on node 244 approximately equals the current limit voltage on the second non-inverting input 250. If the PD 114 is drawing one amp, and the W/L ratio is 1 $(W/L)_P=10,000$ $(W/L)_S$, then 1 amp is conducting through the first drain terminal 206 of the passFET 202 and 0.1 milliamp is conducting through the second drain terminal 212 of the senseFET 204, because of the difference in size of the two MOSFETS. Since 0.1 milliamp conducts through the senseFET 204, then 0.1 milliamp also conducts through M1 224.

In FIG. 2, M2 226 is a replica of M1 224. M2 226 is controlled by the servo amplifier 220 via the fifth node 242 which is coupled to the fourth node 222 of the first output. M2 226 operates in a similar manner as M1 224. The current IM1 254 delivered by M2 226 is imposed across the resistor 246 to generate a voltage. The resistor 246 is, for example 10 kilohm, and since the current conducting through M1 224 is 0.1 milliamp, then the current conducting through M2 226 is also 0.1 milliamp, thus generating a voltage of 1 volt across the resistor 246. The voltage generated across the resistor 246 is provided to the second inverting input of the second amplifier 248 via the sixth node 244. The second amplifier 248 compares the voltage of the second inverting input to the current limit voltage of the second non-inverting input 250. The current limit voltage is a pre-set voltage, so if 1 volt exceeds this preset voltage, then the second amplifier 248 decreases the voltage across the first gate terminal 208 until the voltage across the resistor 246 drops to equal the current limit voltage at the second non-inverting input 250. When the second amplifier 248 lowers the voltage at the second output to the first gate terminal 208 and the second gate terminal 214, it is limiting the current of the PD 114 because decreasing the voltage at the first gate terminal 208 reduces the flow of current from the first drain terminal 206 to the first source terminal 210, providing less current to the PD 114.

However, when the second amplifier 248 decreases the voltage across the first gate terminal 208 and the current conducting across the first drain terminal 206 decreases, the passFET 202 leaves the linear region and enters the saturation region (e.g., where the MOSFET acts as a voltage-controlled current source). This occurs when end device of the PD 114 has a resistance that is less than a certain threshold and the current exceeds the current limit, or when the end device of the PD 114 is shorted and becomes equal to the supply voltage (e.g., the voltage supplied by the PD port 116). If the voltage across the passFET 202 is high, then the voltage across the senseFET 204 is also high, indicating that the servo amplifier 220 includes rail-to-rail input common-mode range. Common mode range is the range of voltage at the inputs of an amplifier for which the amplifier provides at least its minimum rated DC open-loop gain (e.g., the gain obtained when no feedback is used in the circuit). Rail-to-rail input common-mode range is a range in which the voltages include the positive supply to the amplifier and ground, which is typically large (e.g., positive supply may be 50 volts) especially in PoE applications, to operate as intended. For example, a single-supply amplifier is fed by a positive supply and includes a return path that goes back to the ground to which this supply is referenced. In other examples, there are dual-supply amplifiers, which are fed by a positive and a negative supply referenced to a ground, wherein the input common mode range extends from the positive supply voltage down to the negative supply voltage. This provides as a challenge for the current sensing and limiting schematic without the high-voltage transistor and low-voltage transistor because the servo amplifier 220 must also have a low input offset which may be hard to obtain. High voltages on the input stages adds difficulty because the input stages are to be built in order to withstand them.

Figure 3:
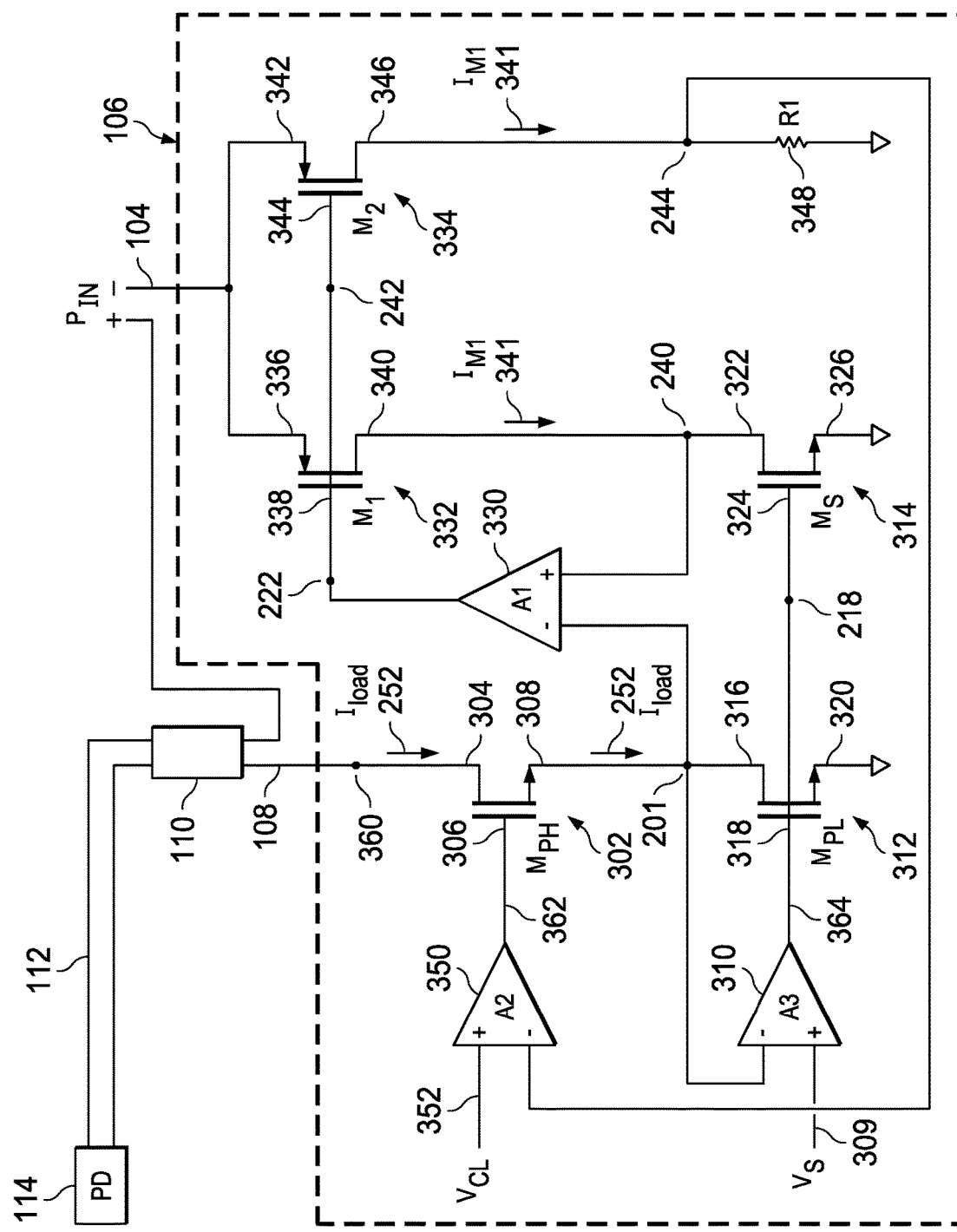
FIG. 3 is a schematic diagram showing additional detail of a disclosed implementation of the current limiting circuit of FIG. 1 including a cascoded transistor.

The example of FIG. 3 depicts an example current limiting circuit that overcomes the challenges of the current sensing and limiting schematic without the high-voltage transistor and low-voltage transistor as described in the paragraphs associated with FIG. 2. The methods to overcome the challenges of the currenting limiting schematic without a high-voltage MOSFET and a low-voltage MOSFET of FIG. 2 are discussed below in connection with FIG. 3. FIG. 3 includes the example current limiting circuit 106, the example power sourcing equipment port (PSE port) 110, the example ethernet cable 112, the example PD 114. The example current limiting circuit 106 of FIG. 3 is a cascoded circuit that includes an example high-voltage MOSFET (Mph) 302, an example amplifier (A3) 310, an example low-voltage MOSFET (Mpl) 312, an example senseFET 314, an example current sense amplifier (A1) 330, an example first control MOSFET (M1) 332, an example second control MOSFET (M2) 334, an example resistor 348, and an example current limit amplifier (A2) 350.

FIG. 3 includes the example PSE port 110 to transmit and receive data and power over the example ethernet cable 112. The PSE port 10 is described in connection with FIG. 1.

FIG. 3 includes the example ethernet cable 112 to communicate between the example PSE 102 and the example PD 114 in power over the ethernet applications. The example ethernet cable 112 is described in connection with FIG. 1.

FIG. 3 includes the example PD 114 to utilize current supplied by the example current limiting circuit 106 via the example Ethernet cable 112. The example PD 114 is a power device circuit. The example PSE port 110 is coupled to the example PD 114 via the example ethernet cable 112, which includes the main receive pair and the main transmit pair. The example PD 114 receives power from h example PSE 102 by means of a direct current imposed on the main transmit pair and main receive pair. The main receive pair of the example Ethernet cable 112 may be coupled to one of the transformers of the example PSE port 110 and the example PD port 116 and the main transmit pair of the example Ethernet cable 112 may be coupled to a different transformer of the example PSE port 110 and the example PD port 116.

FIG. 3 includes the example high-voltage MOSFET Mph 302 to limit current provided by the example current limiting circuit 106 and separate the high voltages of the example PD 114, received by the example ethernet cable 112, from the current sensing MOSFETs discussed in further detail below. The example Mph 302 is a low side drive N-Channel MOSFET and includes an example Mph drain terminal 304, an example Mph gate terminal 306, and an example Mph source terminal 308. The example Mph drain terminal 304 is coupled to output terminal 108 (e.g., current limit terminal 108) at node 360 to receive voltage from the example PD 114 via a center-tap of a transformer in the example PSE port 110, the example Mph gate terminal 306 is coupled to the example current limit amplifier (A2) 350, and the example Mph source terminal 308 is coupled to an example drain terminal 316 of the example low-voltage MOSFET (Mpl) 312.

In some examples, the Mph 302 is the upper transistor because the upper transistor is located above the lower transistor (e.g., Mpl 312). Additionally, Mph 302 may be a first main transistor including a first main transistor drain terminal, a first main transistor gate terminal, and a first main transistor source terminal. Alternatively, the Mph 302 could be a high-side drive N-channel MOSFET, a low-side drive P-Channel MOSFET, or a high-side drive P-Channel MOSFET, wherein the Mph 302 would be coupled to different features of the schematic relative to the type of MOSFET.

FIG. 3 includes the example low-voltage MOSFET (Mpl) 312 to provide small voltages to the example sense amplifier 330 in order for the example senseFET 314 to sense the current drawn by the example PD 114 accurately. The example Mpl 312 is a low side drive N-Channel MOSFET and includes the example Mpl drain terminal 316, an example gate terminal 318, and an example Mpl source terminal 320. The example Mpl drain terminal 316 is coupled to the example Mph source terminal 308 and to an example A1 inverting input at the intermediate node 201. The example Mpl gate terminal 318 is coupled to an example A3 output, in which the A3 output controls the gate-to-source voltage of Mpl 312. The example Mpl source terminal 320 is coupled to a ground terminal.

In some examples, the Mpl 312 is a lower transistor because it is below the upper transistor (e.g., Mph 302). Additionally, Mpl 312 may be a second main transistor including a second main transistor drain terminal, a second main transistor gate terminal, and a second main transistor source terminal. Alternatively, the Mpl 312 could be a second mainFET, a high-side drive N-channel MOSFET, a low-side drive P-Channel MOSFET, or a high-side drive P-Channel MOSFET.

The example high-voltage MOSFET Mph 302 and the example low-voltage MOSFET Mpl 312 replace the single passFET 202 illustrated in FIG. 2 to mitigate the challenges of the current sensing and limiting schematic without the high-voltage MOSFET and low-voltage MOSFET. In some examples, the current sensing and limiting schematic of FIG. 3 is applied in the example current limiting circuit 106 of the PSE 102 to limit self-heating and further increase accuracy of current sensing. Although there are two MOSFETS (e.g., Mph 302 and Mpl 312) instead of one (e.g., the passFET 202), the IEEE 802.3bt requirement of a maximum worst-case resistance applies to a sum of resistances of the MOSFETS (e.g., Mph 302 and Mpl 312). For example, the sum of the on-resistances of example Mph 302 and example Mpl 312 equals the maximum worst-case resistance, thus resulting in a minimal increase in total area size used, relative to the passFET 202 of FIG. 2.

An example manner to determine the size of the two MOSFETS Mph 302 and Mpl 312 is described below. In order to minimize the total area consumed by the two MOSFETS Mph 302 and Mpl 312, the on-resistances of each one of the MOSFETS satisfies Equation 1.

$$\frac{R_{onH}}{R_{onL}} = \sqrt{\frac{R_{spH}}{R_{spL}}} \qquad \text{(Equation 1)}$$

In Equation 1, the variable $R_{onH}$ corresponds to the on-resistance of the example Mph 302. As used herein, the on-resistance of a MOSFET is the drain-to-source resistance between the drain terminal and source terminal when the MOSFET is operating in the linear mode with the maximum allowable gate-to-source voltage. In Equation 1, the variable $R_{onL}$ corresponds to the on-resistance of the example Mpl 312. In some examples, the on-resistance of a high-voltage MOSFET (e.g., Mph 302) is greater than the on-resistance of a low-voltage MOSFET (e.g., Mpl 312) because high-voltage MOSFET device structures usually require larger drain-to-source spacings than low-voltage MOSFET device structures.

In Equation 1, the variable $R_{spH}$ is corresponds to the specific on-resistance of the example Mph 302. As used herein, the specific on-resistance is a figure of merit for power transistors that is determined by measuring the Rds (on) of a MOSFET of a known area. Further, the Rds(on) of the MOSFET is multiplied by the area and the result is the specific on resistance. In this manner, the equation Rds(on) =Rsp/A is used to determine the Rds(on) for a MOSFET of any desired area, or alternatively, the area needed for a MOSFET of any desired on resistance. In Equation 1, the variable $R_{spL}$ corresponds to the specific on-resistance of the example Mpl 312. Typically, the specific on-resistances of high-voltage transistors are greater than the specific on-resistances of low-voltage transistors. For example, if $R_{spH}$ is 16 times the $R_{spL}$, then according to Equation 1, $R_{onH}$ is to be four times that of the $R_{onL}$ (e.g., $R_{onH}$ is to equal ⅘ of the total Ron of the stacked devices, and the $R_{onL}$ is to equal ⅕). This example suggests that adding the low-voltage Mpl 312 does not increase the area of the example schematic significantly.

FIG. 3 includes an example amplifier (A3) 310 to provide voltage to the gate terminals of the example Mpl 312 and the example senseFET 314 in order to regulate the voltage across the example Mpl drain terminal 316 to the example Mpl source terminal 320, while the example PD 114 current Iload 252 varies, to a value that is enough to ensure that sense amplifier 330 does not have to accommodate for low voltages (e.g., microvolts). The example amplifier A3 310 includes an example A3 amplifier non-inverting input, an example A3 amplifier inverting input, and an example A3 amplifier output. The example amplifier A3 310 forces the voltage across the Mpl gate terminal 318 to vary as the PD 114 current Iload 252 varies. For example, the amplifier A3 310 regulates the voltage across the example Mpl drain terminal by adjusting the A3 output to make the A3 inverting input equal to a set-voltage (Vs) 309 of the A3 non-inverting input.

In FIG. 3, the example Vs 309 is typically set to approximately equal the voltage (e.g., 25 millivolts) that would be developed across Mpl 312 if the gate-to-source voltage were set to the maximum allowable value (e.g., 3 volts) and the drain current were set to the current limit. Higher voltages would unnecessarily increase power dissipation within Mpl 312 at high currents, while lower voltages would increase the impact of offset in sense amplifier 330. For example, without amplifier A3 310, if Mpl 312 is 50 milliohms when fully enhanced, then 10 milliamps of Mpl drain 316 current will generate 0.5 millivolts (e.g., 500 microvolts). Therefore, sense amplifier 330 is configured to accommodate for an input offset that is low relative to 0.5 millivolts. Further, to achieve a desired accuracy of, +/−2%, sense amplifier 330 is configured to tolerate an input offset voltage of less than 10 microvolts which may be difficult to achieve.

To address the above challenges, the example amplifier A3 310 is configured to regulate drain-to-source voltage of the example Mpl 312 to a value that is large enough for the sense amplifier 330 to detect. In this manner, better accuracy of current sensing can be achieved. For example, the operation of the sense transistor 314 is optimized by regulated voltage provided by the A3 310. In one implementation, for instance, A3 310 optimizes the operation of the senseFET 314 by regulating the voltage applied to the Mpl gate terminal 318 and the senseFET gate terminal 324 to a set voltage value Vs 309.

If the PD 114 current Iload 252 becomes too large (e.g., becomes close to the current limit value), the amplifier A3 310 will not increase the voltage across the Mpl gate terminal 318 to a large enough value to bring the voltage across the Mpl drain terminal 316 to the value of the set voltage 309. In this manner, the voltage across the Mpl gate terminal 318 rails out and becomes a constant value, then the voltage across the Mpl drain terminal 316 varies as a function of drain current. As a result, the example sense amplifier 330 is configured to regulate the voltage across the senseFET drain terminal 322 to vary with the voltage across the Mpl drain terminal 316.

The example current limiting circuit 106 continues to operate properly, delivering a voltage at node 244, wherein the voltage at node 244 is proportional to the current conducting through the example PSE port 110 and further, the example current limiting circuit 106 implements current limiting by the voltage Vcl 352, even though the voltage at Mpl drain terminal 316 exceeds the voltage at Vs 309. Advantageously, by controlling Mph 302 rather than Mpl 312, Mpl 312 continues to operate in triode region. In this manner, the need for amplifier A1 330 to have a rail-to-rail input stage is eliminated.

FIG. 3 includes the example senseFET 314 to sense the current conducting through the low-voltage MOSFET 312 and determine the example A1 output of the example sense amplifier 330. The example senseFET 314 includes an example senseFET drain terminal 322, and example senseFET gate terminal 324, and an example senseFET source terminal 326. The example senseFET drain terminal 322 is coupled to an example A1 non-inverting input of the sense amplifier 330 via the example third node 240. The example senseFET gate terminal 324 is coupled to the example Mpl gate terminal 318 via the second node 218. The example Mpl source terminal 326 is coupled to the ground terminal.

The example senseFET 314 is a low-side drive N-Channel MOSFET of the same type as the example low-voltage MOSFET 312 but has a different W/L ratio. Additionally, the senseFET 314 could be a sense transistor including a sense transistor drain terminal, a sense transistor gate terminal, and a sense transistor source terminal. Alternative, the senseFET 314 could be a high-side drive N-channel MOSFET, a low-side drive P-Channel MOSFET, or a high-side drive P-Channel MOSFET.

FIG. 3 includes the example current sense amplifier 330 to match the voltage across the example Mpl drain terminal 316 to the example Mpl source terminal 320 with the voltage across the example senseFET drain terminal 322 to the example senseFET source terminal 326 by adjusting an example A1 output to be a voltage value that either increases the current conducting through the example first control MOSFET M1 332 or decreases the current conducting through the example first control MOSFET M1 332. The example sense amplifier 330 includes the example sense amplifier inverting input, an example sense amplifier non-inverting input, and the example sense amplifier output. The sense amplifier inverting input is coupled to the Mpl drain terminal 316 via the intermediate node 201, the sense amplifier non-inverting input is coupled to the senseFET drain terminal 322 via the third node 240, and the sense amplifier output is coupled to an M1 gate terminal 338 via a fourth node 222.

FIG. 3 includes the example first control MOSFET M1 332 to match the current conducting through the example senseFET drain terminal 322 with the current conducting through the example Mpl drain terminal 316. The example first control MOSFET M1 332 is a P-channel MOSFET that includes an example M1 source terminal 336, the example M1 gate terminal 338, and an example M1 drain terminal 340. In some examples, the M1 drain terminal is coupled to the senseFET drain terminal 322 via the third node 240. The first current IM1 341 that conducts through the example M1 drain terminal when the first control MOSFET M1 332 is in saturation operation mode is provided to the example senseFET drain terminal 322. Additionally or alternatively, the example first control MOSFET 332 could be an N-Channel MOSFET, a bipolar junction transistor (BJT), etc.

FIG. 3 includes the example second control MOSFET M2 334 to impose a voltage across the example resistor R1 348. The example second control MOSFET M2 334 is a replica of the example first control MOSFET M1 332 and is therefore a P-Channel MOSFET. The example second control MOSFET M2 334 includes an example M2 source terminal 342, an example M2 gate terminal 344, and an example M2 drain terminal 346. The example M2 gate terminal 344 is coupled to the M1 gate terminal 338 via a fifth node 242 and the example M2 drain terminal is coupled to the example resistor 348 via a sixth node 244. The current conducting through the example M2 drain terminal 346 is the same magnitude as the current that conducts through the example M1 drain terminal 340, therefore it is labeled as IM1 341. For example, the two MOSFETs M1 332 and M2 334 are a replica of each other and receive the same voltage at their gate terminals (M1 gate terminal 338, M2 gate terminal 344) via the example A1 output. Additionally or alternatively, the example second control MOSFET M2 332 could be an N-Channel MOSFET, a bipolar junction transistor (BJT), etc.

FIG. 3 includes the example resistor 348 to generate a voltage based on the first current IM1 341 conducting from the example M2 drain terminal 346 when the example second control MOSFET M2 334 is operating in saturation operation mode. The example resistor 348 is coupled to an example A2 inverting input of the example current limit amplifier 350 at the sixth node 244 and provides the generated voltage to the example A2 inverting input.

FIG. 3 includes the example current limit amplifier A2 350 to control the example high-voltage MOSFET 302 and therefore limit the current provided to the example PD 114 by adjusting the voltage on the example Mph gate terminal 306. The example current limit amplifier A2 350 includes an example A2 amplifier non-inverting input, the example A2 amplifier inverting input, and an example A2 amplifier output 362. The example A2 amplifier output 362 is coupled to the example Mph gate terminal 306 and determines the current conducting through the example Mph 302. A current limit voltage Vcl 352 is provided to the example A2 non-inverting input. The voltage value of Vcl 352 is a set value that is compared to the voltage on the sixth node 244. If the voltage at node 244 exceeds the value of Vcl 352, the example A2 output 362 reduces, and in response, the current conducting through Mph 302 decreases. This reduction of current through Mph 302 is limiting current provided to the example PD 114.

In FIG. 3, the example Mpl 312 is not rated to withstand the voltage at node 360 (e.g., the Mpl 312 will not operate as intended when the voltage at node 360 is opposed across the Mpl 312), but the example Mpl 312 is rated to operate at the maximum current limit voltage Vcl 352 imposed by the example amplifier A2 350, minus the gate-to-source voltage of the example Mph 302. In some examples, a transient event may occur and the A3 310 cannot adjust the voltage at intermediate node 201, but the Mph 302 still protects the Mpl 312 from receiving the transient voltage, because it will drop most of the voltage across the Mph drain terminal 304 and Mph source terminal 308.

This is the first challenge that the current limiting circuit of FIG. 3 overcomes, indicated in the above paragraphs corresponding to the current sense and limit schematic without the high-voltage MOSFET and low-voltage MOSFET of FIG. 2. In some techniques to sense current, problems occurred in the matching between the passFET 202 and the senseFET 204 due to heat dissipation in the passFET 202. If the passFET 202 becomes hotter (e.g., the heat dissipated increases) than the senseFET 204, the matching between the two MOSFETs 202, 204 is disturbed, and the passFET drain terminal 206 current and the senseFET drain terminal 212 current will not be in the same W/L ratio. By splitting the passFET 202 of FIG. 2 into a high-voltage upper MOSFET (e.g., Mph 302) and a low-voltage lower MOSET (e.g., Mpl 312), the Mph 302 dissipates most of the power (e.g., the heat), and the Mpl 312 associated with the senseFET 314 does not. Since the low-voltage MOSFET 312 dissipates less power, the accuracy of current sensing increases due to a reduction in magnitude of the above mentioned problem. Therefore, the current limiting circuit 106 includes accurate current sensing capabilities relative to the current limiting circuit without the high-voltage transistor and the low-voltage transistor of FIG. 2.

The example A3 inverting input is compared to the set-voltage 309 value at the example A3 non-inverting input, and the example amplifier A3 310 acts to match the two inputs. For example, the set-voltage 309 is 25 millivolts and the voltage across the Mpl drain terminal may be greater than that set-voltage 309 value, therefore the amplifier 310 will generate an output voltage to the Mpl gate terminal 318 that will be small enough to keep the low-voltage MOSFET 312 in triode mode operation and match the voltage across the Mpl drain terminal 316 with Vs 309. The example current sense amplifier 330 operates in a similar manner as the servo amplifier 220 of FIG. 2 where the example servo amplifier 330 generates an output in which matches the voltage across the example senseFET drain terminal 322 with the voltage across the example Mpl drain terminal.

This is the second challenge that the current sense and limit schematic of FIG. 3 overcomes, indicated in the above paragraphs corresponding to the current sense and limit schematic without the high-voltage MOSFET and low-voltage MOSFET of FIG. 2. The example amplifier A3 310 regulates the drain-to-source voltage of the low-voltage MOSFET Mpl 312 to a small value in which is the input voltage to the example A1 inverting input. This regulation of input voltage relaxes the requirement for a low input offset voltage of the servo amplifier 330 as compared to the servo amplifier 220 of FIG. 2. For example, without drain voltage regulation, the servo amplifier 220 required a total input offset voltage of no more than 15 microvolts to ensure that no more than 5 percent mismatch in drain voltages for the two MOSFETS (e.g., passFET 202 and senseFET 204) with a minimum on-resistance of 60 milliohms operating at a minimum current of 5 milliamps. By regulating the drain-to-source voltage of the example Mpl 312 to a small voltage value (e.g., 25 millivolts), then a 5 percent mismatch requirement indicates that the example current sense amplifier 330 is to have an input offset of no more than a couple of millivolts (e.g., 1.25 millivolts for 5 percent of 25 millivolts). This input offset value is almost 80 times more input offset than the current sensing and limiting schematic without the high-voltage MOSFET and low-voltage MOSFET offered, which increases the accuracy of sensing the current in the example current limiting circuit 106.

The example sense amplifier 330 overcomes a third challenge indicated in the current sense and limit schematic without the high-voltage MOSFET and low-voltage MOSFET of FIG. 2. Due to the regulated drain-to-source voltage of the low voltage MOSFET Mpl 312, the example servo amplifier 330 does not need to be built to handle rail-to-rail input voltages, as the servo amplifier 220 did. The rail-to-rail input voltages of the schematic without the high-voltage MOSFET and low-voltage MOSFET were due to the high voltage provided over the example ethernet cable 112 via the example PD 114. The voltage across the intermediate node 201 is regulated by the example amplifier A3 310 and is also input into the A1 inverting input of the example current sense amplifier 330, which means the example sense amplifier 330 can be built for input voltages near ground. In some worst case examples, due to transients, the voltage across the intermediate node 201 may increase.

In other examples, the Mpl 312 could be operating at the worst case maximum on-resistance and highest Iload 252 resulting in the Mpl 312 entering the saturation region. If these two worst case examples occur, the common mode range for the example servo amplifier 330 is to extend one to two volts above ground to meet these objections, in which is better than designing the amplifier to handle rail-to-rail input voltages. For example, a rail-to-rail design includes two input differential pairs, one optimized for low voltages and one for high voltages. By reducing the required input common mode range, the example of FIG. 3 eliminates the need for separate input differential pairs.

In FIG. 3, the example senseFET 314 is in operation with the example low-voltage MOSFET Mpl 312, wherein when Mpl 312 is in linear mode operation, the senseFET 314 is also in linear mode operation. For example, when the amplifier A3 310 generates an output voltage to the Mpl gate terminal 318 that is a value in which regulates the drain-to-source voltage of Mpl 312 to operate in triode mode, that output voltage is also generated across the senseFET gate terminal 324 therefore acting to keep the senseFET 314 in triode operation mode. If the voltage across the example senseFET gate terminal 324 to the example senseFET source terminal 326 is positive and exceeds the threshold voltage of the example senseFET 314, then the example senseFET 314 conducts the first current IM1 341 through the example senseFET drain terminal 322.

In some examples, the first current IM1 341 is provided by the example first control MOSFET M1 332 and changes when the A1 output changes. For example, sense amplifier 330 controls the current IM1 341 by utilizing M1 332, and current IM1 341 imposed across the drain-to-source resistance of the senseFET 314 generates a voltage that sense amplifier 330 forces to approximately match to the voltage generated by Iload 252 conducting through Mpl 312. Thus, the currents IM1 341 and Iload 252 are forced to be in the same ratio as the W/L values of the example Mpl 312 and the example senseFET 314.

In this manner, the example of FIG. 3 has an advantage over the current sensing and limiting schematic without the high-voltage MOSFET and low-voltage MOSFET illustrated in FIG. 2. Due to the example senseFET 314 gate terminal 324 receiving the example amplifier 310 output voltage, it is operating in the linear region (e.g., triode mode operation). Therefore, the example senseFET 314 does not need to be optimized for robustness because it operates in the linear region, and if a transient (e.g., a short duration surge of electrical energy) occurs, the drain-to-source voltage across Mpl 312 is limited to the difference between Mph gate terminal 306 voltage and the Mpl gate-to-source voltage. The example schematic of FIG. 3 does not need to correct for hot-carrier generation of the example senseFET 314 which simplifies the circuitry. Hot carriers are defined as holes or electrons that have gained high kinetic energy after being accelerated by a strong electric field in areas of high field intensities within a MOSFET, and due to their high kinetic energy, can get injected into the areas of the MOSFET that form a space charge that causes the device to degrade or become unstable.

In FIG. 3, the example schematic includes the second control MOSFET M2 334 to impose the first current IM1 341 across the example resistor 348 to generate a voltage. The generated voltage is provided to the A2 inverting input of the example current limit amplifier 350 and compared to the current limit voltage Vcl 352 of the A2 non-inverting input. The voltage generated by the example resistor 348 is proportional to the current drawn by the example PD 114. The example current limit voltage 352 is a value that represents the desired current limit of the example PD 114. If the example PD 114 is not drawing too much current, then current limiting will not be engaged. If the example PD 114 is drawing too much current, current limiting is engaged, as indicated by the voltage generated by the resistor 348. In this manner, the voltage at node 244 increases above Vcl 352, current limit amplifier A2 350 throttles back the voltage provided to the Mph gate terminal 306, and the current to the example PD 114 is reduced until the voltage at node 244 equals Vcl 352.

Figure 4:
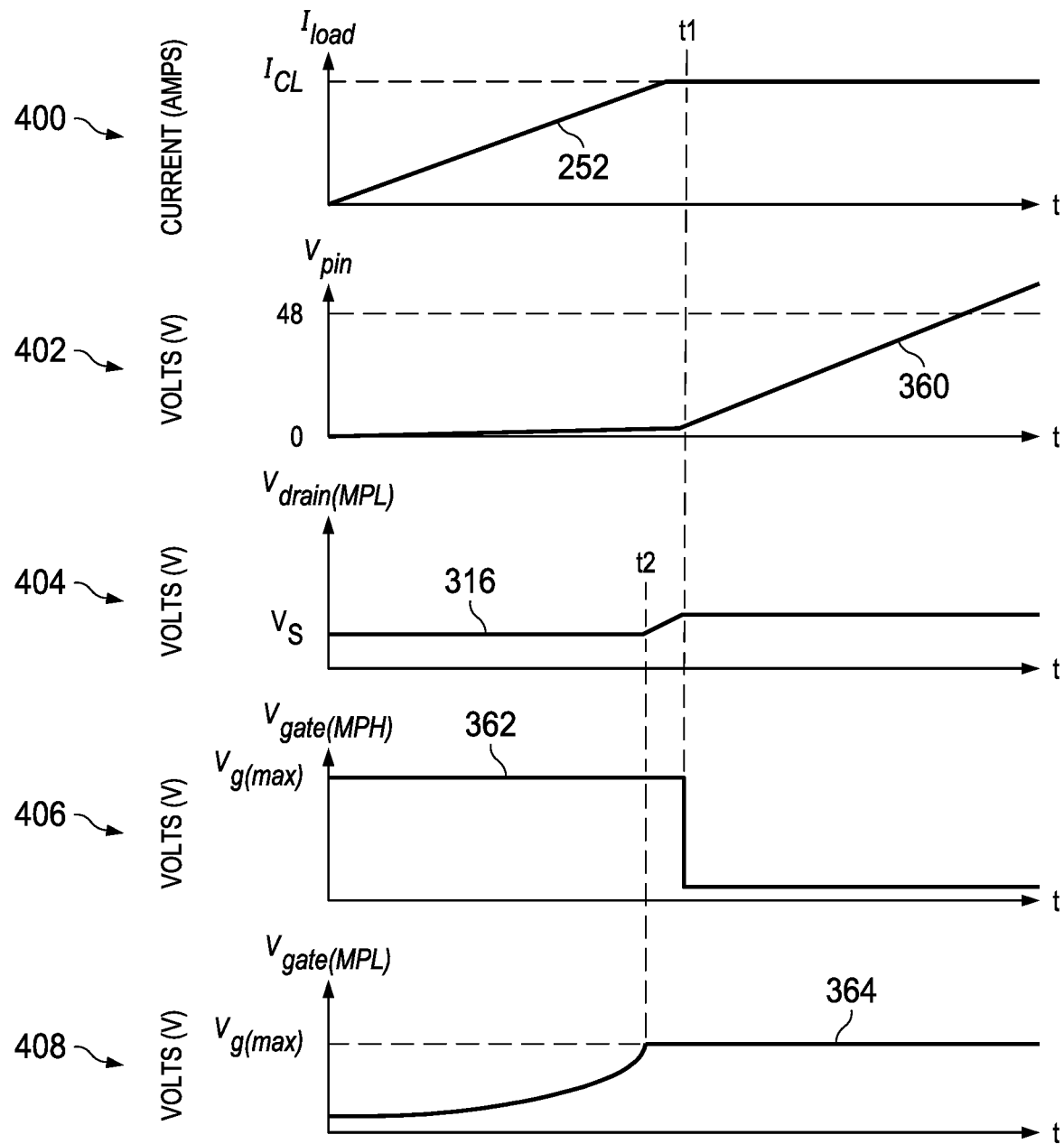
FIG. 4 is signal plot illustrating current and voltage signals the example current limiter of FIG. 3.

FIG. 4 is an example graph illustrating the voltage signals and current signals of the example PD 114, the example high-voltage MOSFET Mph 302, and the example low-voltage MOSFET Mpl 312. FIG. 4 includes an example first graph 400, an example second graph 402, an example third graph 404, an example fourth graph 406, and an example fifth graph 408. The example first graph 400 depicts the external load Iload current 252, the example second graph 402 depicts the voltage at the example node 360, the example third graph 404 depicts the voltage at the example Mpl drain terminal 316, the example fourth graph 406 depicts the voltage at the example A2 output pin 362, and the example fifth graph 408 depicts the voltage at the example A3 output pin 364.

In FIG. 4, the example first graph 400 depicts the example PD 114 current Iload 252 as a signal increasing to the current limit imposed by the example current limit amplifier A2 350. For example, the resistance of the end device of the PD 114 may be decreasing, and therefore, the current conducting through it is increasing. As the Iload 252 current is increasing, the example current limit amplifier 350 outputs a high voltage (e.g., Vg(max)) to the example Mph gate terminal 306 to keep the example Mph 302 on, until the PD 114 current Iload 252 reaches the current limit at time t1. In the example fourth graph 406, Vg(max) is defined as the maximum voltage the circuit will apply to the gate, which should not exceed the maximum operating voltage allowed by the device's specifications. In this manner, providing the maximum amount of voltage to the example Mph gate terminal 306 fully enhances the high-voltage MOSFET 302 and minimizes its on-resistance (e.g., Rdson). For example, the second graph 402 depicts the voltage at node 360 at a low voltage (e.g., near zero volts) when the current Iload 252 starts at zero. Further, the voltage at node 360 rises linearly with the current Iload 252 to time t1 because the Mph 302 is operating in the linear region.

In FIG. 4, the example third graph 404 depicts the voltage across the Mpl drain terminal 316 which is regulated by the example amplifier A3 310 to equal Vs 309. For example, A3 310 matches the Mpl drain terminal 316 to equal the value of Vs 309 by adjusting voltage across the A3 output 364 that is coupled to the Mpl gate terminal 318. By adjusting the voltage applied to the example Mpl gate terminal 318, the example A3 output 364 is controlling the amount of voltage flowing through the example Mpl 312, which is why the voltage signal at the example Mpl drain terminal 316 is a flat line, equal to Vs 309, until it reaches time t2.

In FIG. 4, the example fifth graph 408 depicts the voltage on the A3 output 364 that is applied to the example Mpl gate terminal 318 increasing until time t2. For example, as the current Iload 252 increases, the voltage across the A3 output 364 increases to keep the voltage across the Mpl drain terminal at the same value as Vs 309. The curve depicted in the example fifth graph 408 continues to increase until it reaches time t2, which indicates the maximum gate voltage (Vg(max)) of the example Mpl 312. For example, when the voltage across the A3 output 364 is increasing, there is a limit to which it can increase to, and that limit is the maximum voltage the Mpl gate terminal 318 should be subjected to. In some examples, Vg(max) is defined by the manufacturer of the transistors in order to keep the transistor from becoming damaged.

In FIG. 4, when the current Iload 252 is increasing (first graph 400), example amplifier A3 310 outputs an increasing voltage at the A3 output 364 (fifth graph 408) to keep the voltage across the example Mpl drain terminal 316 equal to Vs 309 (third graph 404) until the A3 output 364 voltage equals the Vg(max) of the example Mpl 312. When the example A3 output 364 voltage equals Vg(max) of the example Mpl 312 at time t2, the example amplifier A3 310 will stop increasing the A3 output 364 voltage and provide Vg(max) voltage to the example Mpl gate terminal 318. Further, when the example A3 output 364 voltage stops increasing, the voltage across the example Mpl drain terminal 316 increases relative to the voltage Vs 309. For example, because the amplifier A3 310 can no longer act to match the Mpl drain terminal 316 with Vs 309 by adjusting its output 364 voltage, then the voltage across the Mpl drain terminal 318 begins to increase, as shown in the third graph 404 at time t2.

At time t1, when the current Iload 252 reaches the current limit, as shown in the example first graph 400, the example current limit amplifier A2 350 reduces the voltage provided to the Mph gate terminal 306 (fourth graph 406). For example, the current limit amplifier A2 350 imposes the current limit by controlling the switching characteristics of Mph 302. When the example current limit amplifier A2 350 reduces the output voltage to the Mph gate terminal 306, it reduces the current conducting through the example Mph 302 by forcing it to transition from the linear region to the saturation region. In this manner, at time t1, the voltage across the example Mpl drain terminal 316 (third graph 404) ceases to increase and becomes a flat signal because the Mpl drain terminal 316 voltage is now a function of the current Iload 252 which is also a flat signal. As used herein, the term flat is defined as the signal displayed in a graph in which is not increasing or decreasing as time increases.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

From the foregoing, it will be appreciated that example methods, apparatus and articles of manufacture have been disclosed that sense and limit the current of high voltage applications by cascoding a high-voltage MOSFET with a low-voltage MOSFET to increase the accuracy of the current sensing and therefore properly limit the current provided to an external load such as a powered device. The disclosed methods, apparatus and articles of manufacture improve the efficiency of using a computing device by increasing the accuracy of the current sensing techniques in order to efficiently limit the current to a high-voltage externa load. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising,
a first transistor having a first current terminal, a second current terminal, and a first control terminal, the first current terminal coupled to an output terminal;
a second transistor having a third current terminal, a fourth current terminal, and a second control terminal, the third current terminal coupled to the second current terminal and the fourth current terminal coupled to a ground terminal;
a third transistor having a fifth current terminal, a sixth current terminal, and a third control terminal, the third control terminal coupled to the second control terminal;
a fourth transistor having a seventh current terminal, an eighth current terminal, and a fourth control terminal, the eighth current terminal coupled to the fifth current terminal;
a fifth transistor having a ninth current terminal, a tenth current terminal, and a fifth control terminal, the fifth control terminal coupled to the fourth control terminal and the ninth current terminal coupled to the seventh current terminal;
a first amplifier having a first inverting input and a first amplifier output, the first inverting input coupled to the tenth current terminal and the first amplifier output coupled to the first control terminal;
a second amplifier having a second amplifier output coupled to the second control terminal and to the third control terminal; and
a third amplifier having a second inverting input coupled to the second current terminal, a non-inverting input coupled to the fifth current terminal, and a third amplifier output coupled to the fourth control terminal.

2. The apparatus of claim 1, wherein the first transistor, the second transistor, and the third transistor are N-Channel metal oxide semiconductor field effect transistors and the fourth transistor is a P-Channel metal oxide semiconductor field effect transistor.

3. The apparatus of claim 1, wherein the first transistor is coupled to a power sourcing equipment port via the output terminal.

4. The apparatus of claim 1, wherein the second transistor is cascoded with the first transistor.

5. The apparatus of claim 1, wherein the third transistor is coupled between the fourth transistor and the ground terminal.

6. An apparatus comprising,
a cascoded circuit having an output terminal, the cascoded circuit comprising a first transistor and a second transistor, the first transistor having a first current terminal coupled to the output terminal, a second current terminal, and a first control terminal, the second transistor having a third current terminal, a fourth current terminal, and a second control terminal;
a first amplifier coupled to the first control terminal, the first amplifier configured to control a current through the first transistor;

a third transistor having a fifth current terminal, a sixth current terminal, and a third control terminal, the third control terminal coupled to the second control terminal, the third transistor configured to determine the current;

a fourth transistor having a seventh current terminal, an eighth current terminal, and a fourth control terminal, the eighth current terminal coupled to the fifth current terminal, the first amplifier configured to receive a voltage indicating a current through the fourth transistor; and a second amplifier coupled to the second control terminal and to the third control terminal, the second amplifier configured to control a first voltage across the second transistor and a second voltage across the third transistor.

7. The apparatus of claim 6, further comprising a sense amplifier having a sense amplifier inverting input coupled to the third current terminal, a sense amplifier non-inverting input coupled to the fifth current terminal, and a sense amplifier output coupled to the fourth control terminal.

8. The apparatus of claim 7, wherein the sense amplifier is configured to match a voltage across the third transistor to a voltage across the second transistor.

9. The apparatus of claim 6, further comprising a resistor configured to provide the voltage indicating the current through the fourth transistor.

10. The apparatus of claim 9, wherein the first amplifier is configured to compare the voltage produced by the resistor to a current limit voltage, and the first amplifier is configured to control the current conducting through the first transistor based on the comparison.

11. The apparatus of claim 6, wherein the output terminal is adapted to be coupled to an ethernet cable via a port, wherein the port is configured to provide power to the ethernet cable.

12. The apparatus of claim 11, wherein the first amplifier in operation with the first transistor is configured to control power the port provides to the ethernet cable.

13. A system comprising:

a power sourcing equipment (PSE) circuit having an input terminal and an output terminal, the PSE circuit comprising:

a current limiting circuit coupled between the input terminal and the output terminal, the current limiting circuit comprising:

a first transistor having a first current terminal, a second current terminal, and a first control terminal, the first current terminal coupled to the output terminal;

a second transistor having a third current terminal, a fourth current terminal, and a second control terminal, the third current terminal coupled to the second current terminal and the fourth current terminal coupled to a ground terminal;

a third transistor having a fifth current terminal, a sixth current terminal, and a third control terminal, the third control terminal coupled to the second control terminal;

a fourth transistor having a seventh current terminal, an eighth current terminal, and a fourth control terminal, the eighth current terminal coupled to the fifth current terminal;

a fifth transistor having a ninth current terminal, a tenth current terminal, and a fifth control terminal, the fifth control terminal coupled to the fourth control terminal and the ninth current terminal coupled to the seventh current terminal;

a first amplifier having a first amplifier output and an inverting input, the first amplifier output coupled to the first control terminal and inverting input coupled to the tenth current terminal; and a second amplifier having a second amplifier output coupled to the second control terminal and to the third control terminal;

a PSE port coupled to the output terminal; and a power device circuit coupled to the PSE port.

14. The system of claim 13, wherein the current limiting circuit is configured to sense current relative to the current limiting circuit by the fourth transistor.

15. The system of claim 13, wherein the first transistor has a first area and the second transistor has a second area, the first area greater than the second area.

16. The system of claim 15, wherein the second transistor is configured to dissipate less heat than the first transistor.

17. The system of claim 13, wherein the output terminal is an Ethernet cable configured to provide power and data to the power device circuit and to limit the power to the power device circuit when current conducting through the output meets a threshold.

18. The system of claim 17, wherein the threshold determines a value of current the power device circuit or the current limiting circuit is configured to conduct before either the power device circuit or the current limiting circuit become damaged.

* * * * *